(12) United States Patent
Lee

(10) Patent No.: US 6,570,786 B2
(45) Date of Patent: May 27, 2003

(54) NAND-TYPE MEMORY ARRAY AND METHOD OF READING, PROGRAMMING AND ERASING USING THE SAME

(75) Inventor: Sang Yong Lee, Seoul (KR)

(73) Assignee: Hynix Semiconductorr Inc., Kyungki-Do (KR)

( * ) Notice: Subject to any disclaimer, the term of this patent is extended or adjusted under 35 U.S.C. 154(b) by 0 days.

(21) Appl. No.: 10/021,298

(22) Filed: Dec. 19, 2001

(65) Prior Publication Data

US 2003/0002340 A1 Jan. 2, 2003

(30) Foreign Application Priority Data

Jun. 28, 2001 (JP) .......................................... 2001-037794

(51) Int. Cl.[7] .............................................. G11C 16/04
(52) U.S. Cl. ............................ 365/185.17; 365/185.01; 365/189.01
(58) Field of Search ...................... 365/185.17, 185.18, 365/185.01, 189.01, 185.27

Primary Examiner—David Nelms
Assistant Examiner—Connie C. Yoha
(74) Attorney, Agent, or Firm—Morgan, Lewis & Bockius LLP

(57) ABSTRACT

The present invention relates to a NAND-type memory array and method of reading, programming and erasing the same. In order to solve a problem that a reading speed is lowered due to a large well loading upon a reading operation as the well and the bit line are connected in order to apply a negative bias upon a programming operation and a positive bias upon an erasure operation in a NAND-type memory array using a dip trench isolation (DTI) scheme, the present invention separates the well and the bit line by additionally including a well node for applying a bias to the well upon an erasure and reading operation, a triple well select gate for selecting the well node, and a program well select gate for applying a bias to the well via the bit line upon a programming operation. Therefore, the present invention can lower in the speed upon a reading operation.

9 Claims, 3 Drawing Sheets

|         | BL    | TPWELL | SOURCE | DSL | SSL | CG | TNWELL |
|---------|-------|--------|--------|-----|-----|----|--------|
| READ    | 0~1V  | 0      | 3      | 5   | 5   | 3  | 3      |
| Program | -9    | -9     | 0      | 0   | -9  | 9  | 0      |
| Erase   | 9     | 9      | F      | F   | F   | -9 | 9      |

|         | BL    | Vtpwell | SOURCE | DSL | SSL | PWS | TPS |
|---------|-------|---------|--------|-----|-----|-----|-----|
| READ    | 0~1V  | 0~1V    | 3      | 5   | 5   | 0   | 3   |
| Program | -9    | 0       | 0      | 0   | 0   | 3   | -9  |
| Erase   | 9     | 9       | F      | F   | F   | 0   | 12  |

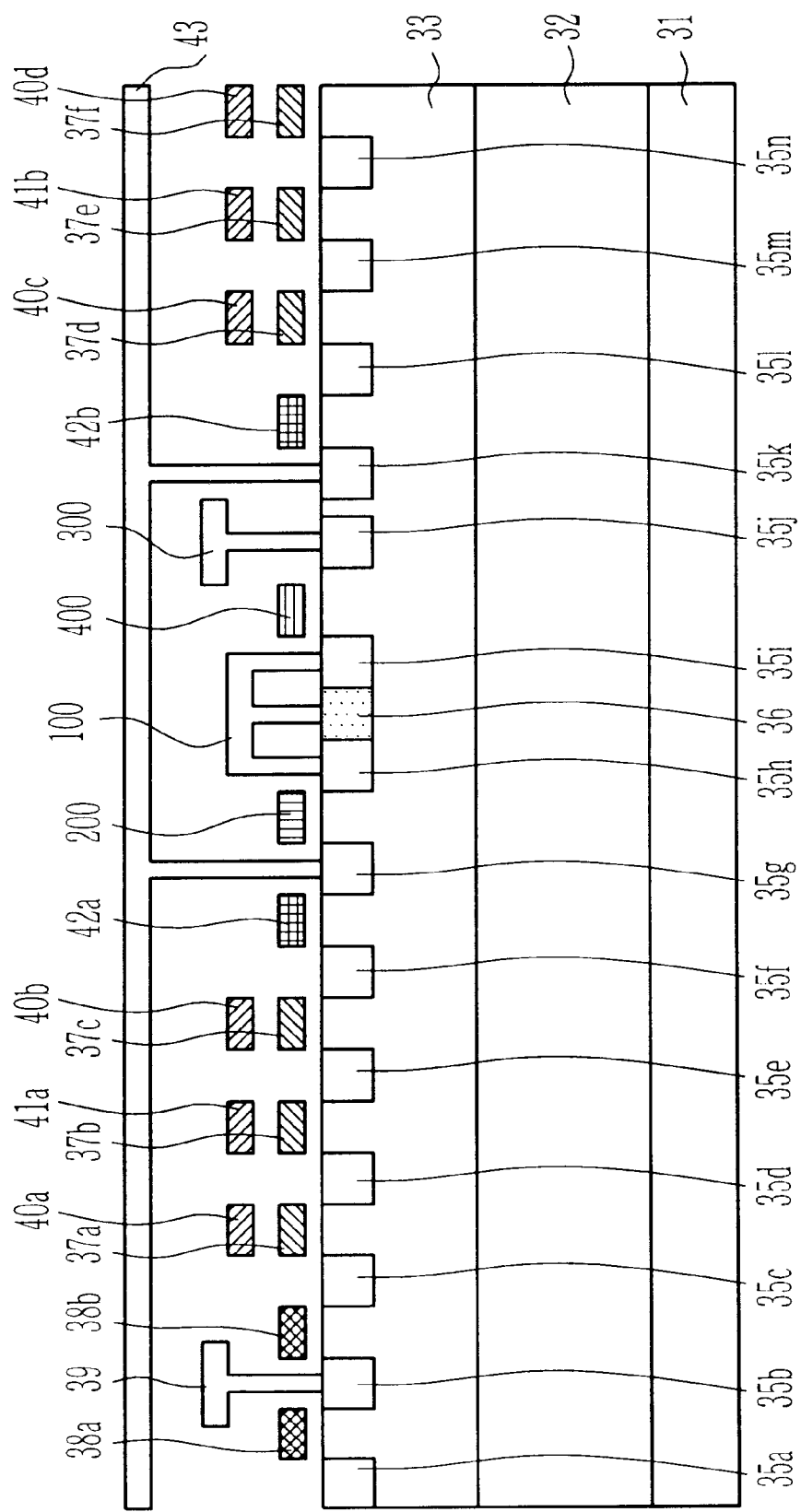

NAND-TYPE MEMORY ARRAY AND METHOD OF READING, PROGRAMMING AND ERASING USING THE SAME

BACKGROUND OF THE INVENTION

1. Field of the Invention

The invention relates generally to a NAND-type memory array and method of reading, programming and erasing the same, and more particularly to, a NAND-type memory array and method of reading, programming and erasing the same capable of preventing lowering in the read speed by separating well and bit line.

2. Description of the Prior Art

Generally, in a NAND-type memory array using a deep trench isolation (DTI) scheme, all the well bias is applied via bit line upon reading, programming and erasure since it employs an independent well.

FIGS. 1A and 1B are cross-sectional views of a conventional NAND-type memory array, wherein FIG. 1A is a cross-sectional view of the memory array taken along in a word line direction of the array and FIG. 1B is a cross-sectional view of the memory array taken along in a bit line direction of the array.

A construction of the conventional NAND-type memory array will be described by reference to FIGS. 1A and 1B.

Referring now to FIG. 1A, a triple N well 12 is formed on a P type substrate 11 and triple P well 13 are then formed to be included in the triple N well 12. The triple P well 13 are divided by a plurality of numbers, by means of a plurality of dip trench device isolation films 14. Floating gates 17 are formed on the triple P well 13, respectively. Word lines 20 are overlapped with the floating gates 17.

Referring now to FIG. 1B, first~eleventh $N^+$ junctions 15a~15k and a $P^+$ junction 16 are formed within the triple P well 13 in an isolated fashion. First~sixth floating gates 17a~17f are formed on the triple P well 13 in an isolated fashion. Source nodes 19 are connected to the second $N^+$ junction 15b. Each of first~second source select lines 18a and 18b is formed at both sides of the second $N^+$ junction 15b. A bit line 23 is connected to a $P^+$ junction 16, and seventh and eighth $N^+$ junctions 15g and 15h formed at both sides of the $P^+$ junction 16, respectively.

A first drain select line 22a is formed at one side of the seventh $N^+$ junction 15g and a second drain select line 22b is formed at one side of the eighth $N^+$ junction 15h. Between a second source select line 18b and the first drain select line 22a, a first pass gate 20a is overlapped with the first floating gate 17a, a first cell gate 21a is overlapped with the second floating gate 17b, a second pass gate 20b is overlapped with the third floating gate 17c. At this time, the first cell gate 21b is located between the first pass gate 20a and the second pass gate 20b. Similarly in the second drain select line 22b, a third pass gate 20c is overlapped with the fourth floating gate 17d, a second cell gate 21b is overlapped with the fifth floating gate 17e and a fourth pass gate 20d is overlapped with the sixth floating gate 17f.

In the above, each of the source node 19, the source select lines 18a and 18b, the drain select lines 22a and 22b, the pass gates 20a~20d, and the cell gates 21a and 21b is formed in the triple P well 13 in a crossing direction. The bit line 23 is formed in a direction of the triple P well 13.

It is known that the NAND-type memory array is based on the above construction and this basic construction is constantly arranged.

An operation of reading, programming and erasing the conventional NAND-type memory array will be described by reference to FIG. 2 showing a node bias condition of the NAND-type memory array.

First, the read operation includes applying a voltage of 0~1V to the bit line 23, applying a voltage of 0V to the triple P well 13, applying a voltage of 3V to the source node 19, applying a voltage of 5V to the drain select line 22, applying a voltage of 5V to the source select line 18, applying a voltage of 3V to the cell gate 21 and applying a voltage of 3V to the triple N well 12.

The program operation includes applying a voltage of −9V to the bit line 23, applying a voltage of −9V to the triple P well 13, applying a voltage of 0V to the source node 19, applying a voltage of 0V to the drain select line 22, applying a voltage of −9V to the source select line 18, applying a voltage of 9V to the cell gate 21 and applying a voltage of 0V to the triple N well 12.

The erase operation includes applying a voltage of 9V to the bit line 23, applying a voltage of 9V to the triple P well 13, making the source node 19 floated, making the drain select lines 22 floated, making the source select lines 18 floated, applying a voltage of −9V the cell gate 21 and applying a voltage of 9V to the triple N well 12.

In the above conventional NAND-type memory array, as the triple P well 13 is independently driven by the dip trench device isolation film 14 in structure, it is required that all the well bias be applied via the bit line 23 upon reading, programming and erasure operation.

It is inevitable that the bias is applied to the well in programming and erasure operations using this method. In a reading operation, however, there is a problem that the read speed is lowered due to a well loading if this method is used. In other words, if a voltage of 3V is applied to the source node 19 and a voltage of 3V is applied to the cell gate 21 upon a reading operation, a bias passing the cell is applied to the bit line 23, which charges the well via the $P^+$ junction 16. As such, as the loading of the triple P well 13 is generated upon a reading operation, delay in the speed is caused.

SUMMARY OF THE INVENTION

The present invention is contrived to solve this problem and an object of the present invention is to provide a NAND-type memory array and method of reading, programming and erasing the same capable of preventing lowering in the speed upon a reading operation, by separating well and bit line.

In order to accomplish the above object, a NAND-type memory array according to the present invention is characterized in that it comprises P type substrate in which a triple P well is formed; first~eighth $N^+$ junctions, a $P^+$ junction and ninth fourteenth $N^+$ junctions, which are sequentially formed within the triple P well; first~sixth floating gates formed on the triple P well; source node connected to the second $N^+$ junction; first and second source select lines each formed at both sides of the second $N^+$ junction; bit line each connected to the seventh and eleventh $N^+$ junctions; first drain select line formed at one side of the $N^+$ junction and second drain select line formed at one side of the eleventh $N^+$ junction; first pass gate, first cell gate and second pass gate each formed between the second source select line and the first drain select line; third pass gate, second cell gate and fourth pass gate each formed on the triple P well on the second drain select line' side; interconnection line connecting the eighth $N^+$ junction, the $P^+$ junction and the ninth $N^+$ junction, respectively; program well select gate formed between the seventh N⁺ junction and the eighth N⁺ junction; P well node connected to the tenth N⁺ junction between the ninth N⁺ junction and the eleventh N⁺ junction; and triple P well select gate formed between the ninth N⁺ junction and the tenth N⁺ junction, wherein the elements being a basic construction and this basic construction is constantly arranged.

In the above, the triple P well is formed within the triple N well. The pass gates and the cell gates are overlapped with the floating gates, respectively. The cell gates have the pass gates located at its both side, respectively.

The source nodes, the source select lines, the drain select lines, the pass gates and the cell gates are each formed in a direction crossing with the triple P well. The bit line are formed in a direction of the triple P well.

A reading method in a NAND-type memory array comprises applying a voltage of 0~1V to a bit line, applying a voltage of 0~1V to a triple P well, applying a voltage of 3V to a source node, applying a voltage of 5V to a drain select line, applying a voltage of 5V to a source select line, applying a voltage of 0V to a program well select gate and applying a voltage of 3V to a triple P well select gate.

A programming method in a NAND-type memory array comprises applying a voltage of −9V to a bit line, applying a voltage of 0V to a P well node, applying a voltage of 0V to a source node, applying a voltage of 0V to a drain select line, applying a voltage of 0V to a source select line, applying a voltage of 3V to a program well select gate and applying a voltage of −9V to a triple P well select gate.

An erasing method in a NAND-type memory array comprises applying a voltage of 9V to a bit line, applying a voltage of 9V to a P well node, making a source node floated, making a drain select line floated, making a source select line floated, applying a voltage of 0V to a program well select gate and applying a voltage of 12V to a triple P well select gate.

BRIEF DESCRIPTION OF THE DRAWINGS

The aforementioned aspects and other features of the present invention will be explained in the following description, taken in con junction with the accompanying drawings, wherein:

FIG. 2 is a node bias condition of a conventional NAND-type memory array;

FIGS. 3A and 3B are cross-sectional views of a NAND-type memory array according to one embodiment of the present invention; and FIG. 4 is a node bias condition of a NAND-type memory array according to one embodiment of the present invention.

DETAILED DESCRIPTION OF PREFERRED EMBODIMENTS

The present invention will be described in detail by way of a preferred embodiment with reference to accompanying drawings.

Figure 1A:
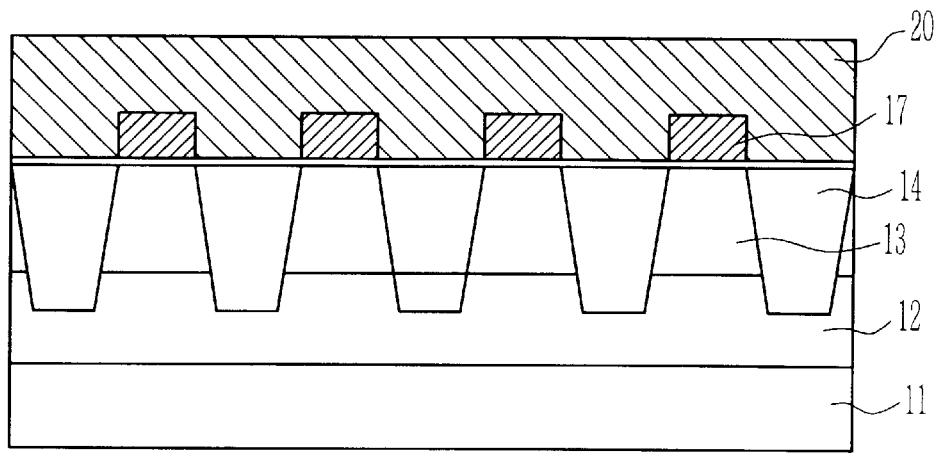
FIGS. 1A and B are cross-sectional views of a conventional NAND-type memory array.
Figure 1B:
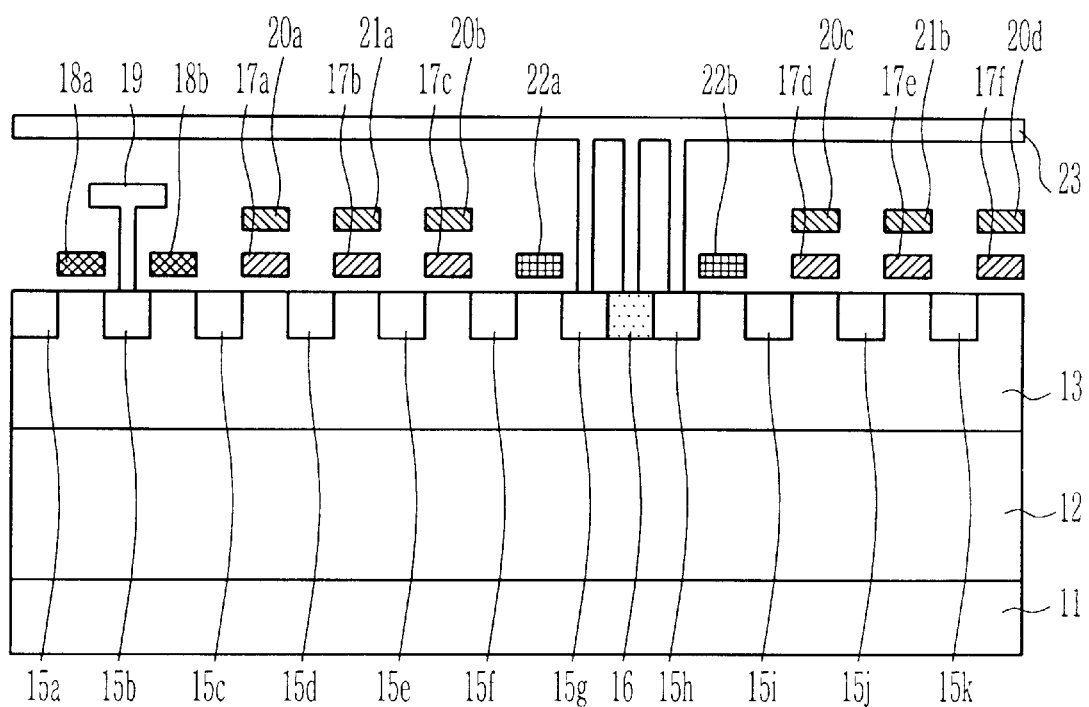
Figures 2, 3A, 4:
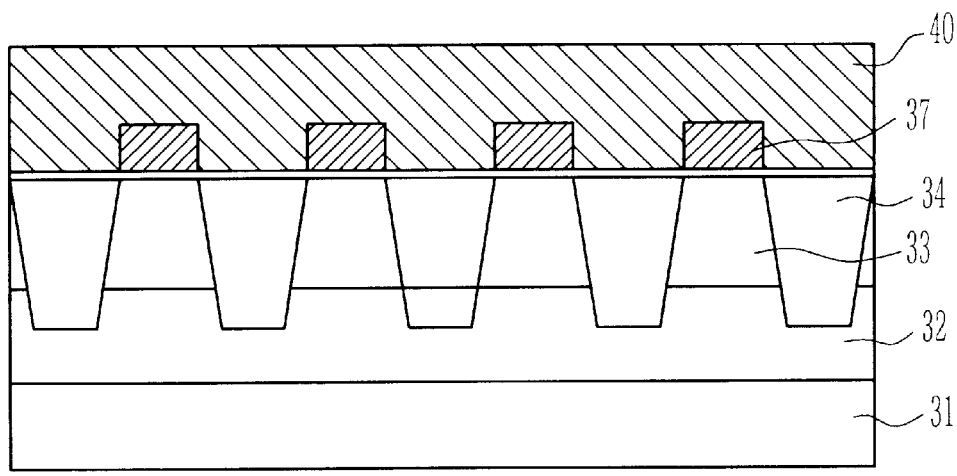

FIGS. 3A and 3B are cross-sectional views of a NAND-type memory array according to one embodiment of the present invention, wherein FIG. 3A is a cross-sectional view of the memory array taken along in a word line direction of the array and FIG. 3B is a cross-sectional view of the memory array taken along in a bit line direction of the array.

A construction of an NAND-type memory array according to the present invention will be described by reference to FIGS. 3A and 3B.

Referring now to FIG. 3A, a triple N well 32 is formed on a P type substrate 31 and triple P well 23 are then formed to be included in the triple N well 32. The triple P well 33 are divided by a plurality of numbers, by means of a plurality of dip trench device isolation films 34. Floating gates 37 are formed on the triple P well 33, respectively. Word lines 40 are overlapped with the floating gates 37.

Referring now to FIG. 3B, first~eighth N+ junctions 35a~35h, a P+ junction 36 and ninth~fourteenth N+ junctions 35i~35n are sequentially formed with the triple P well 33 in an isolated fashion. First sixth floating gates 37a~37f are sequentially formed on the triple P well 33 in an isolated fashion. Source nodes 39 are connected to the second N+ junction 35b. Each of first and second source select lines 38a and 38b is formed at both sides of the second N+ junction 35b. A bit line 43 is connected to the seventh and eleventh N+ junctions 35g and 35k, respectively.

A first drain select line 42a is formed at one side of the seventh N⁺ junction 35g and a second drain select line 42b is formed at one side of the eleventh N⁺ junction 35k. Between a second source select line 38b and the first drain select line 42a, a first pass gate 40a is overlapped with the first floating gate 37a, a first cell gate 41a is overlapped with the second floating gate 37b, a second pass gate 40b is overlapped with the third floating gate 37c. At this time, the first cell gate 41a is located between the first pass gate 40a and the second pass gate 40b. Similarly in the second drain select line 42b, a third pass gate 40c is overlapped with the fourth floating gate 37d, a second cell gate 41b is overlapped with the fifth floating gate 37e and a fourth pass gate 40d is overlapped with the sixth floating gate 37f.

In the above, each of the source node 39, the source select lines 38a and 38b, the drain select lines 42a and 42b, the pass gates 40a~40d, and the cell gates 41a and 41b is formed in the triple P well 33 in a crossing direction. The bit line 43 is formed in a direction of the triple P well 33.

The present invention adds a new construction as below in order to prevent a well loading upon a reading operation.

In the above structure, the bit line 43 is connected to the seventh and eleventh N⁺ junctions 35g and 35k, respectively. Between the seventh and eleventh N⁺ junction 35g and 35k, each of the eighth N⁺ junction 35h, the P⁺ junction 36 and the ninth N⁺ junction 35i is connected to an interconnection line 100. A program well select gate 200 is formed between the seventh N⁺ junction 35g connected to the bit line 43 and the eighth N⁺ junction 35h connected to the interconnection line 100. The P well node 300 is connected to the tenth N⁺ junction 35j between the eleventh N⁺ junction 35k connected to the bit line 43 and the ninth N⁺ junction 35i connected to the interconnection line 100. The triple P well select gate 400 is formed between the ninth N⁺ junction 35i and the tenth N⁺ junction 35j.

In the above, the P well node 300 is for applying a bias of the well upon erasing and reading operation, the triple P well select gate 400 is for selecting the P well node 300 and the program well select gate 200 is for applying a bias to the well via the bit line 43 upon a programming operation.

A NAND-type memory array is based on the above construction and this basic construction is constantly arranged.

An operation of reading, programming and erasing the conventional NAND-type memory array will be described by reference to FIG. 4 showing a node bias condition of the NAND-type memory array.

First, the read operation includes applying a voltage of 0~1V to the bit line 43, applying a voltage of 0~1V to the triple P well 100, applying a voltage of 3V to the source node 49, applying a voltage of 5V to the drain select line 42, applying a voltage of 5V to the source select line 38, applying a voltage of 0V to the program well select gate 200 and applying a voltage of 3V to the triple P well select gate 400.

In the above, upon a reading operation, if a voltage of 3V is applied to the source node of the cell, a voltage of 5V is applied to the source select line, a voltage of 5V is applied to the pass gate, a voltage of 3V is applied to the cell gate and a voltage of 5V is applied to the drain select line, the voltage in the source passes through a cell string and is transmitted to the bit line, so that the voltage can be read. At this time, as the program well select gate has a voltage of 0V, a bias of the bit line is not transmitted to the well but a bias of the P well node is applied to the P well due to 3V of the triple P well select gate.

The program operation includes applying a voltage of −9V to the bit line 43, applying a voltage of 0V to the P well node 300, applying a voltage of 0V to the source node 49, applying a voltage of 0V to the drain select line 42, applying a voltage of 0V to the source select line 38, applying a voltage of 3V to the program well select gate 200 and applying a voltage of −9V to the triple P well select gate 400.

In the above, bit programming can be performed upon a programming operation. The bit line to be programmed are applied with a negative voltage and the bit line not to be programmed are applied with a voltage of 0V. In case of programming the bit line, as the negative bias of the bit line is applied to the connected $N^+$ junction, and the triple P well and the $N^+$ junction are diode turn-on, the bias of the triple P well becomes negative. As the program well select gate is 3V, the bias of the triple P well become same to that of the bit line via the $P^+$ junction. At this time, if a positive bias is applied to the cell gate, the cell gate is programmed by means of a channel Fowle-Nordhein tunneling.

The erase operation includes applying a voltage of 9V to the bit line 43, applying a voltage of 9V to the P well node 300, making the source node 49 floated, making the drain select line 42 floated, making the source select line 38 floated, applying a voltage of 0V to the program well select gate 200 and applying a voltage of 12V to the triple P well select gate 400.

In the above, upon an erasure operation, a positive bias is applied to the entire well and a negative bias is applied to a selected cell gate, so that an erasure operation is performed by channel Fowle-Nordhein tunneling. If a positive bias is applied to the P well and a bias higher than the P well node is applied to the triple P well select gate, a positive bias is applied to the entire P well separated via the $P^+$ junction. If a negative bias is applied to the cell gate, the cell is erased.

As mentioned above, the present invention separates well and bit line by additionally using a well node for applying a bias to a well upon an erasure and reading operation, a triple well select gate for selecting the well node, and a program well select gate for applying a bias to the well via the bit line upon a programming operation. Therefore, the present invention has an advantage that it can prevent lower in the speed upon a reading operation and thus implement a device having a rapid reading speed.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A NAND-type memory array, comprising:

a P type substrate;

a triple P well formed in said P type substrate;

first through fourteenth N junctions formed in said triple P well;

a P+ junction formed in said triple P well, wherein said first through eighth N+ junctions, said P+ junction, and said ninth through fourteenth N+ junctions are sequentially formed within said triple P well;

first through sixth floating gates formed on said triple P well;

a source node connected to said second N+ junction;

first and second source select lines each formed at both sides of said second N+ junction;

a bit line connected to said seventh and eleventh N+ junctions;

a first drain select line formed at one side of said N+ junction;

a second drain select line formed at one side of said eleventh N+ junction;

a first pass gate formed between said second source select line and said first drain select line;

a first cell gate formed between said second source select line and said first drain select line;

a second pass gate formed between said second source select line and said first drain select line;

a third pass gate formed on said triple P well on said second drain select line side;

a second cell gate formed on said triple P well on said second drain select line side;

a fourth pass gate formed on said triple P well on said second drain select line side;

an interconnect line connecting said eighth N junction, said P+ junction and said ninth N+ junction;

a program well select gate formed between said seventh N+ junction and said eighth N+ junction;

a P well node connected to said tenth N+ junction between said ninth N+ junction and said eleventh N+ junction; and a triple P well select gate formed between said ninth N+ junction and said tenth N+ junction.

2. The array according to claim 1, further comprising:

a triple N well formed in the P type substrate, wherein said triple P well is formed within the triple N well.

3. The array according to claim 1, wherein at least one of said pass gates and at least one of said cell gates are overlapped with at least one of said floating gates.

4. The array according to claim 1, wherein at least one of said cell gates has at least one of said pass gates located at both sides.

5. The array according to claim 1, wherein said source node, said source select lines, said drain select lines, said pass gates, and said cell gates are each formed in a direction crossing with said triple P well.

6. The array according to claim 1, wherein said bit line is formed in a direction of said triple P well.

7. A reading method for the NAND-type memory array of claim 1, the method comprising:

applying a voltage of between 0 and 1 V to the bit line;

applying a voltage of between 0 and 1 V to the triple P well;

applying a voltage of 3V to the source node;

applying a voltage of 5V to at least one drain select line;

applying a voltage of 5V to at least one source select line;

applying a voltage of 0V to the program well select gate; and applying a voltage of 3V to the triple P well select gate.

8. A programming method for the NAND-type memory array of claim 1, the method comprising:

applying a voltage of −9V to the bit line;

applying a voltage of 0V to the P well node;

applying a voltage of 0V to the source node applying a voltage of 0V to at least one drain select line;

applying a voltage of 0V to at least one source select line;

applying a voltage of 3V to the program well select gate; and applying a voltage of −9V to the triple P well select gate.

9. An erasing method for the NAND-type memory array of claim 1, the method comprising:

applying a voltage of 9V to the bit line;

applying a voltage of 9V to the P well node;

making the source node floated;

making at least one drain select line floated;

making at least one source select line floated;

applying a voltage of 0V to the program well select gate; and applying a voltage of 12V to the triple P well select gate.

* * * * *